United States Patent [19]
Van Heteren et al.

[11] Patent Number: 5,436,600
[45] Date of Patent: Jul. 25, 1995

[54] MRI MULTI-FREQUENCY DSB AND SSB RF SYNTHESIZER

[75] Inventors: John Van Heteren, San Francisco; Mitsuaki Arakawa, Hillsborough; Lawrence E. Crooks, Richmond; John C. Hoenninger, III, Oakland; Thomas McDermott, Redwood City, all of Calif.; Keiji Furui, Otawara, Japan

[73] Assignee: The Regents of the University of California, Oakland, Calif.

[21] Appl. No.: 283,050

[22] Filed: Jul. 29, 1994

[51] Int. Cl.[6] .............. H03B 28/00; H03C 1/52; H03C 1/60; G01R 33/24
[52] U.S. Cl. .................. 332/167; 324/314; 327/105; 332/170
[58] Field of Search .......... 332/167, 168, 170; 327/105, 106, 107; 375/43, 61; 455/46, 47, 109; 324/307, 314, 309

[56] References Cited

U.S. PATENT DOCUMENTS

| | | | |
|---|---|---|---|
| 4,908,578 | 3/1990 | Van Liere | 324/309 |
| 4,992,743 | 2/1991 | Sheffer | 332/149 |
| 4,998,072 | 3/1991 | Sheffer | 327/106 |
| 5,162,763 | 11/1992 | Morris | 332/170 |

OTHER PUBLICATIONS

Holland et al, "an Overview of Digital Spectrometers for MR Imaging", SMRI REPORT, pp. 241–246, Mar.-/Apr. 1992.
"Q2334 Dual Direct Digital Synthesizer Technical Data Sheet", QUALCOMM INCORPORATED, Jun. 1988, pp. 1–19.

Primary Examiner—Siefried H. Grimm
Attorney, Agent, or Firm—Nixon & Vanderhye

[57] ABSTRACT

A local frequency generator employing a single crystal oscillator, latches and direct digital synthesizer circuits digitally produces all signals needed in the transmitter channel of a MRI system to generate MRI transmitter RF pulses. The local frequency generator is operable in both the single side band and double side band modes and has the capability of switching between the modes. The generator is constructed with a phase resetting capability for providing the plural output frequencies needed for making plural MRI slices.

21 Claims, 3 Drawing Sheets

MRI MULTI-FREQUENCY DSB AND SSB RF SYNTHESIZER

FIELD OF THE INVENTION

The invention is in the field of digital frequency generators for use in magnetic resonance imaging (MRI) utilizing nuclear magnetic resonance (NMR) phenomena.

BACKGROUND OF THE INVENTION

In Magnetic Resonance Imaging (MRI), the transmitter may be set to transmit at a particular RF frequency as a function of a specified polarization magnetic field strength. The frequencies to which the transmitter can be set are known as the Larmor frequencies, which are the NMR frequencies at which a nucleus precesses. The Larmor frequency is varied by a small amount $\Delta F$, to image NMR nuclei within a number of "slices" within an object (e.g., a human body).

In prior art systems, the production of the Larmor frequencies involved using analog local oscillator circuits which inherently have RF carrier leakage in the amplitude modulation circuit for the double side band (DSB) and single side band (SSB) modes, as well as unwanted side bands in quadrature amplitude modulation. Moreover, analog circuits are characteristically imprecise in the setting of parameters and have operating characteristics that are nonlinear and prone to drift with time and temperature.

A discussion of digital technology in MRI systems appears in an article by Holland and MacFall, "An Overview of Digital Spectrometers for MR Imaging" published in the March/April 1992 issue of JMRI, Volume 2, No. 2 at pages 241-246. Holland and MacFall conclude that the use of digital technology offers improvements in precision and accuracy that lead to improved fidelity of section profiles, dynamic range, image S/N, calibration and maintenance requirements. In FIG. 2 of the article a digital system of a simplified design is described. This system uses a digital synthesizer chip, consisting of input registers and a phase accumulator (NCMO), and a PROM to generate a digitized sine wave, and amplitude modulates digitally by multiplying the digitized sine wave by a modulation waveform.

BRIEF DESCRIPTION OF THE INVENTION

The invention is a local frequency generator circuit that employs direct digital synthesizer (DDS) circuits for generating multiple local frequencies from a single crystal oscillator. The local frequencies are gated and mixed in a transmitter channel to produce a selected RF frequency. Through the use of direct digital synthesizer circuits, digital multipliers and adders, amplitude and quadrature modulation are affected in the digital domain. This eliminates expensive analog frequency synthesizers, analog amplitude modulation circuits and analog quadrature modulation circuits, and the adjustments needed to maintain the performance of the RF modulation circuits. Moreover, analog quadrature modulation is difficult to achieve with less than $-40$ dB unwanted side band suppression, whereas digital quadrature modulation does not have the unwanted side band. A digital frequency synthesizer vis-a-vis an analog system provides very fine frequency and phase control, reduces the number of components required and makes it easier to design digital receivers.

In the local frequency generator, all necessary local frequencies for the transmitter and receiver channels are derived from DDS circuits, the clock frequency, and divisions of the clock frequency. The transmitter channel additionally uses harmonics of divisions of the clock frequency as frequency sources. Each appropriate harmonic is selected by band pass filtering. The digital approach allows extremely stable quadrature modulation and elimination of RF carrier leakage, resulting in more accurate slice selectivity and advanced sequence techniques.

DETAILED DESCRIPTION OF THE INVENTION

The MRI transmitter generates RF energy at a specific Larmor frequency ($f_{LAR}$) for a specified magnetic field strength. The circuits of the present invention are designed to generate the local frequencies from which the Larmor frequency is generated. TABLE 1 is a frequency chart showing the field strengths, the Larmor frequencies, the intermediate frequencies and the local frequencies.

| Field Strength | $f_{LAR}$ (MHz) | DDS Center Frequency (MHz) | Output of *M (MHz) | $f_{LAR}$ + 8.7 (MHz) | DDS $\Delta f$ | DDS Side Band carrier (MHz) |
|---|---|---|---|---|---|---|
| 0.064 T | 2.74 | 11.45 | — | 11.45 | 10.66667 ±$\Delta f$ | 2 |
| 0.35 T | 14.9 | 4.5 | 19.2 | 23.67 | 10.66667 ±$\Delta f$ | 2 |
| 0.5 T | 21.3 | 6.09 | 24.04 | 30.09 | 10.66667 ±$\Delta f$ | 2 |
| 1.5 T | 63.9 | 7.44 | 80.0 | 72.56 | 10.66667 ±$\Delta f$ | 2 |

A direct digital synthesizer circuit is a well known circuit for producing digitized samples of a sine wave. Conventionally, it comprises a chip consisting of an input register, a phase accumulator and a sine lookup table. A digitized sine wave is produced by accumulating at a specified clock rate increments of preset value from the input register in the phase accumulator and translating the accumulated phase value into a digital representation of the instantaneous amplitude of a waveform via a lookup table. A DDS circuit may also comprise a microcontroller, which may be included in the chip, one of the functions of which is setting the increment register with a preset increment value for input to the phase accumulator. A clock or reference is another input to the DDS circuit that controls the rate at which phase increments are accumulated. In some DDS circuits a second phase increment register may be used for storing and switching a different increment value into the phase accumulator. The digitized sine wave output of the DDS circuit is coupled to a digital to analog converter and a filter to produce a sine wave. The output waveform is periodic and variable in frequency over a bandwidth with fine frequency resolution. Construction of DDS circuits using very large scale integrated circuit techniques produces devices having low power consumption and small size. The Stanford Telecom STEL-1177 chip and the Qualcomm Inc. Q2334 chip are examples of DDS chips. As in the Qualcomm Inc. Q2334 chip, more than one frequency synthesizing section DDS circuit may be provided on an integrated circuit chip.

Figure 1:
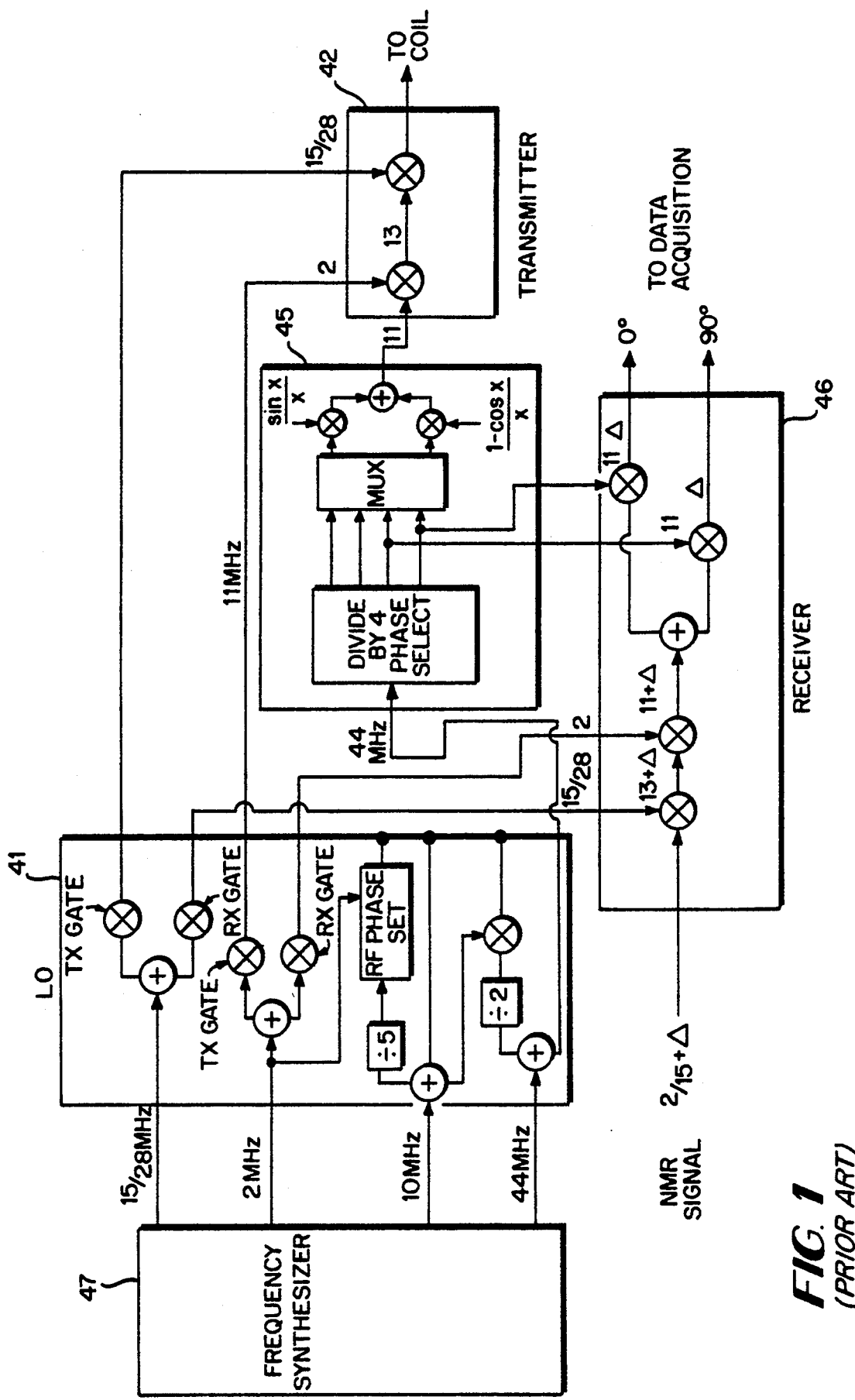
FIG. 1 is a block diagram of a prior art analog transmitter/receiver system.

FIG. 1 is a block diagram of a prior art analog transmitter/receiver system. The system includes a local oscillator 41 which uses signals received from frequency synthesizer 47 to generate the operating frequencies for transmitter channel 42 and receiver channel 46. Also included is an 11 MHz section 45 which divides the received 44 MHz signal into four different phase 11 MHz signals, two of which go through mixers to become amplitude modulated. Frequency synthesizer 47 is an expensive component. Analog section 45 produces only four phases and the amplitude modulated signals contain undesired carrier feedthrough signals. Furthermore, in single side band mode, an unwanted side band is produced that has to be suppressed.

Figure 2:
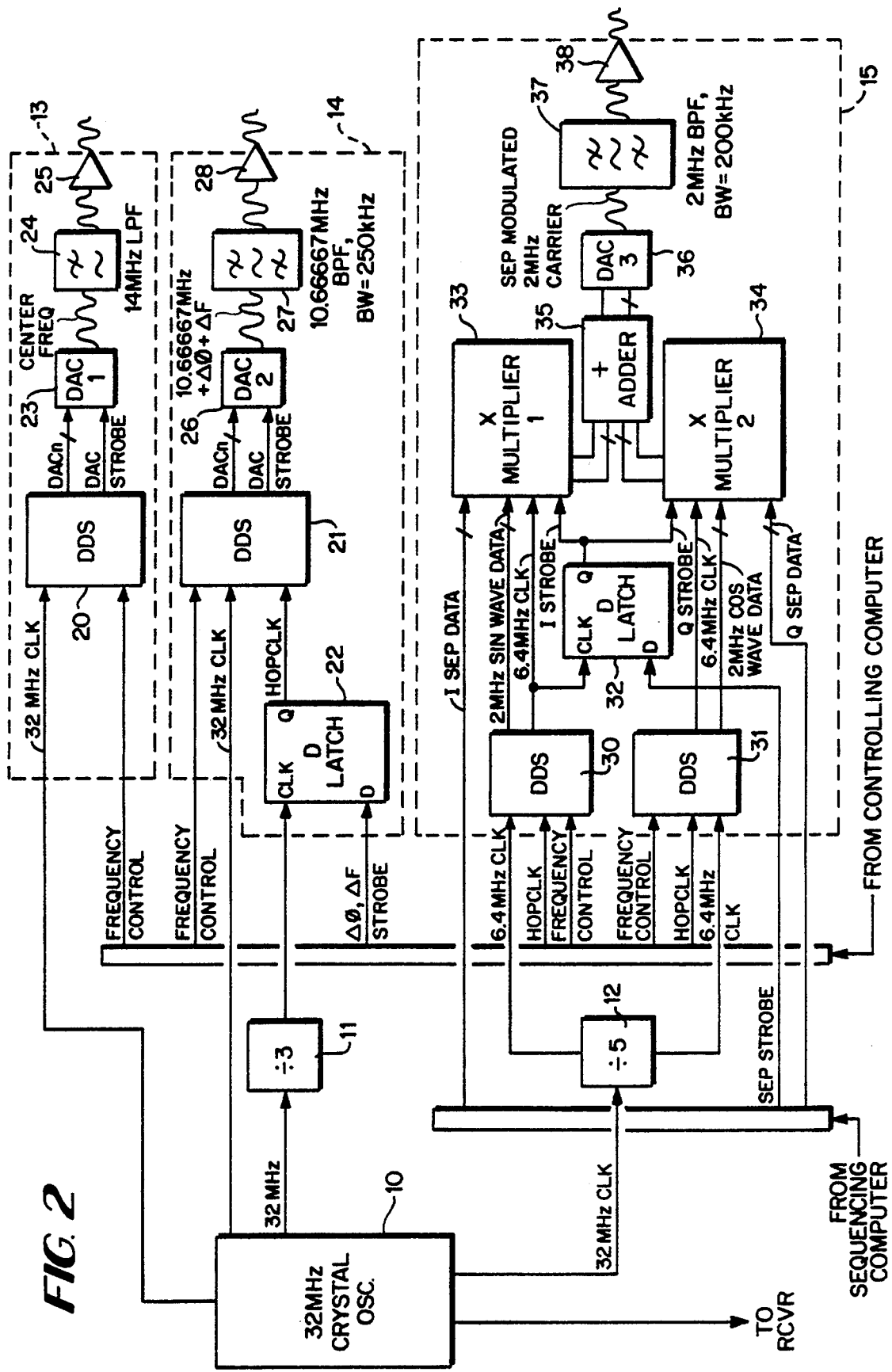
FIG. 2 is a detailed illustration of a local frequency generator circuit.

FIG. 2 illustrates a circuit for generating the local frequencies for use in MRI transmitter and receiver channels. The local frequency generating circuit is comprised of a 32 MHz crystal oscillator forming a clock, a divider for dividing the clock by 3, a divider for dividing the clock by 5, and DDS based frequency generating sections. This frequency generating circuit produces outputs comprising a 32 MHz signal, a DDS center frequency (11.45, 4.5, 6.09, or 7.44 MHz), a DDS $\Delta F$ frequency (10.66667 MHz$\pm$125 kHz), and a DDS single side band/double side band (SSB/DSB) signal on a 2 MHz carrier frequency. Specifying the DDS $\Delta F$ frequency to be 10.66667 MHz$\pm$125 kHz herein means that the 10.66667 MHz may have a delta f at any value in the range of $\pm$125 kHz, i.e., the output can be at any frequency between 10.54167 MHz and 10.79167 MHz.

In FIG. 2, section 13 generates the DDS center frequency, section 14 generates the DDS $\Delta F$ frequency, and section 15 generates the DDS SSB/DSB frequency. The components comprising the FIG. 2 circuit are identified as follows. Items 20, 21, 30 and 31 are each a DDS circuit. Where a single integrated circuit chip contains two DDS circuits (e.g. the Q2334 chip), with an A section and a B section, DDS circuits 20 and 21 would be formed in one chip and DDS circuits 30 and 31 would be formed in a second chip. Component 10 is a 32 MHz crystal oscillator. The crystal oscillator provides a 32 MHz clock signal which is used directly and, in addition, is divided by 3 in divider 11 to provide a 10.66667 MHz clock and divided by 5 in divider 12 to provide a 6.4 MHz clock. A D-latch circuit 22 synchronizes a strobe signal from a controlling computer with the clock frequency. Components 23 through 28 convert digitized signals to sine waves, filter and amplify them. In section 15, a second D-latch 32 synchronizes a strobe signal from a sequencing computer. The D-latch strobe output, 6.4 MHz clock, 2 MHz sine and cosine wave data, and selective excitation profile modulation data are applied to digital multipliers 33 and 34. The products output from the multipliers are added in digital adder 35 to provide modulated digitized data. Components 36, 37 and 38 convert the modulated digitized data to an analog signal, filter and amplify it.

DDS circuit 20 generates a DDS center frequency with inputs from the 32 MHz clock and frequency control signal from a controlling computer. DDS circuit 21 generates a DDS $\Delta F$ frequency, with inputs from the 32 MHz clock, a synchronized strobe (HOPCLK), and frequency control signal from a controlling computer. The center frequency, in digitized form, is converted in a digital to analog converter 23 to a sine wave, filtered in a 5th order low pass filter (14 MHz) 24 and amplified in amplifier 25. Similarly, the digitized frequency DDS $\Delta F$ is converted to a sine wave in digital to analog converter 26, filtered in band pass filter (10.66667 MHz, 250 kHz bandwidth) 27 and amplified in amplifier 28. The narrow bandwidth filter 27 smooths the DAC output, changing it from a fixed update rate staircase waveform into a sine wave not containing any sampling spur noise. In addition, the filter 27 also shields the 8.67 MHz frequency from 6.66667 MHz spurious signals on the $\Delta F$ channel. If not filtered, this 6.66667 MHz spurious signal would mix with 2 MHz to introduce noise into the 8.67 MHz signal.

In taking multiple slices, the $\Delta F$ frequency of 10.66667 MHz$\pm\Delta F$ may be incrementally changed and then reset within the $\pm$125 kHz frequency range. In the present DDS circuit, frequency ($\Delta F$) and phase ($\Delta\phi$) changes are accomplished with a double buffer register construction, where one phase increment value is held in an inactive buffer, and another is held in an active buffer. The DDS HOPCLK input clocks the phase increment values from the inactive buffer to the active buffer. D-latch 22 synchronizes the phase change as the $\Delta F$ output is reset. Discussing the phase of a signal only has meaning when the signal is compared to a different reference signal; in this case, the constant, unchanging reference signal is provided by divider 11, and its value is $32/3 = 10.6$ MHz. To perform its function, the D-latch 22 has three connections: the 10.6 MHz reference frequency is provided to its CLK input, the $\Delta\phi\Delta F$ strobe is applied to the D input, and the Q terminal provides the HOPCLK output to the DDS chip. When the $\Delta\phi\Delta F$ strobe line is activated by the sequencing computer, the D-latch waits until the next 10.6 MHz clock tick before sending the HOPCLK signal to the DDS chip. In this way, when the $\Delta F$ channel is reset to the 10.66667 MHz, the D-latch acts to synchronize any desired phase change to the reference 10.6 MHz signal. Unlike the prior art analog system, the resetted phase can be at any angle ($\Delta\phi$) with respect to the reference signal (the desired $\Delta\phi$ value must already have been loaded into the phase increment register. If an 8 bit value had been loaded, then the output phase can be set to any angle $360°/2^8 = 1.406$ degree increments). If the D-latch was not present, then the $\Delta\phi\Delta F$ strobe would cause the DDS chip to change phase at any one of the main clock (32 MHz) ticks, which would result in phase values with 120° uncertainty. This D-latch scheme requires that both the DDS output (10.66667 MHz) and the reference signal (10.6 MHz) be integral divisors of the main DDS clock (in this case, 32 MHz).

A controlling computer provides inputs such as phase increment value or values for register A, phase increment value for a separate register B if used, configuration data, and register addresses. Where multiple $\Delta F$ frequencies are used, the register buffers are sequentially reloaded and activated. A sequencing computer is used in MRI systems to control the imaging process. As understood by those skilled in the art, it provides a multitude of signals to coordinate the imaging. Selective excitation profile data and strobe signals are provided by the sequencing computer to the quadrature amplitude modulation section for providing amplitude modulated signals.

DDS circuits 30 and 31 and associated components generate a modulated 2 MHz single side band or double side band (SSB/DSB) signal. The DDS circuits 30 and 31 receive a 6.4 MHz clock from clock divider 12, HOPCLKs and phase increment values and configuration data from the controlling computer. DDS circuit 30 outputs 2 MHz digital sine wave data and DDS circuit 31 outputs 2 MHz digital cosine wave data. The outputs are synchronized by the HOPCLKs from the controlling computer. That is, here there is no synchronization via a latch, because there is no frequency or phase change during a scan. Synchronization is achieved at initialization or before each scan and the outputs stay in sync.

The sequencing computer provides I (in-phase) and Q (quadrature phase) selective excitation profile data (I SEP data and Q SEP data) and a selective excitation profile strobe (SEP strobe). A D-latch 32 synchronizes the SEP strobe to provide for synchronization of the I and Q SEP amplitude modulation input data with the clock. SEP amplitude modulation of the 2 MHz sine wave data is accomplished in digital multiplier 33. SEP amplitude modulation of the 2 MHz cosine wave data is accomplished in multiplier 34. The addition of the outputs of the multipliers in digital adder 35 provides for quadrature modulation. Digital multipliers 33 and 34 are low power CMOS circuits. Digital to analog converter 36 provides a SEP quadrature modulated 2 MHz signal that is subsequently filtered in band pass filter 37 and amplified in amplifier 38. Band pass filter 37 is a 5th order filter centered at 2 MHz with a 3 dB bandwidth of 200 kHz. A fixed update rate of 6.4 MHz is a source of 2.4 MHz noise. The band pass filter 37 provides for attenuation of this aliased noise. The update rate of the SEP waveform can also be a source of noise. That is, if the updating is every 10 usec, harmonic sidebands produce noise at 100 kHz and these can excite remote slices in the object. By updating the SEP waveforms every 4 usec the side bands are 250 kHz away and the 200 kHz band pass filter 37 effectively reduces the noise effects from this source.

The latch 32, as described above, provides for synchronization of any asynchronous arriving amplitude modulation data at the multipliers by synchronizing the SEP strobe with the clock. Without this latch, the modulation would still occur, but spikes or glitches would appear in the output whenever the multiplier had not finished its calculations but new data had been clocked in.

The I SEP and Q SEP data signals producing the amplitude modulation are digitized waveshapes provided in accordance with the sequencing of the ΔF for imaging different slices and are also a function of the magnetic field gradient. They are data representing modulation having the general form of $$\text{sinc}(kt) = \frac{\sin (kt)}{kt}$$

and $$\text{cosinc}(kt) = \frac{1 - \cos (kt)}{kt}.$$

There are several ways to cancel one of the side bands. The lower side band can be cancelled leaving only the upper side band of bandwidth 0 to W by using either I SEP=Wsinc(2t), Q SEP=Wcosinc (2t), or I SEP=-Wcosinc(2t), Q SEP=Wsinc(2t). These two signals differ by only a 90 degree phase shift. The upper side band is cancelled leaving only the lower side band of bandwidth −W to 0 by using either I SEP=Wsinc(2t), Q SEP=−Wcosinc(2t) or I SEP=−Wcosinc(2t), Q SEP=Wsinc(2t). Once again, these two signals differ by only a 90 degree phase shift. As can be appreciated, selection between upper and lower side band is just a sign inversion, changing of the polarity, of the cosinc component. Interchanging the in-phase and quadrature modulations changes the resulting spectrum from real to imaginary, i.e., a 90 degree phase shift.

The lines carrying the I SEP and Q SEP signals are also used to provide for switching from the single side band mode to the double side band mode. Replacing the cosinc with zero gives double side band modulation. For double side band the RF pulses for bandwidths of 2W(−W to +W) are twice the amplitude of pulses with bandwidths of W. They thus require four times the peak power. Since they are twice as fast their energy is only twice as large.

The single side band mode provides for greater sharpness in signal with less RF power. For some advanced sequences, it is imperative to operate in the upper side band in the single side band mode and in others the lower side band in the single side band mode. Having the capability to operate in the double side band mode provides for a conventional operating mode. With modulation of one of the lines set to zero, specifically the Q SEP line, the system operates in the double side band mode. This drives the output of multiplier 34 to zero. As is apparent for double side band only operation, multiplier 34 and adder 35 are unnecessary.

The preceding discussion has used sinc and cosinc, but these are not the most general modulation functions that can give double side band and upper/lower side band operation. The kind of modulation that has these properties has a middle that can be defined as time zero. A symmetric double side band spectrum arises from a modulation function that is an even function i.e., f(t)=f(−t). The middle corresponds to some peak or valley of the function. An anti-symmetric spectrum arises from an odd modulation function i.e., f(t)=−f(−t). It would be zero or not continuous at the middle. Using such even and odd functions to modulate two quadrature carriers lets half of the anti-symmetric spectrum cancel half of the symmetric spectrum leaving an upper or lower side band spectrum. The general situation is then setting the odd modulation function to zero to have double side band modulation.

Figure 3:
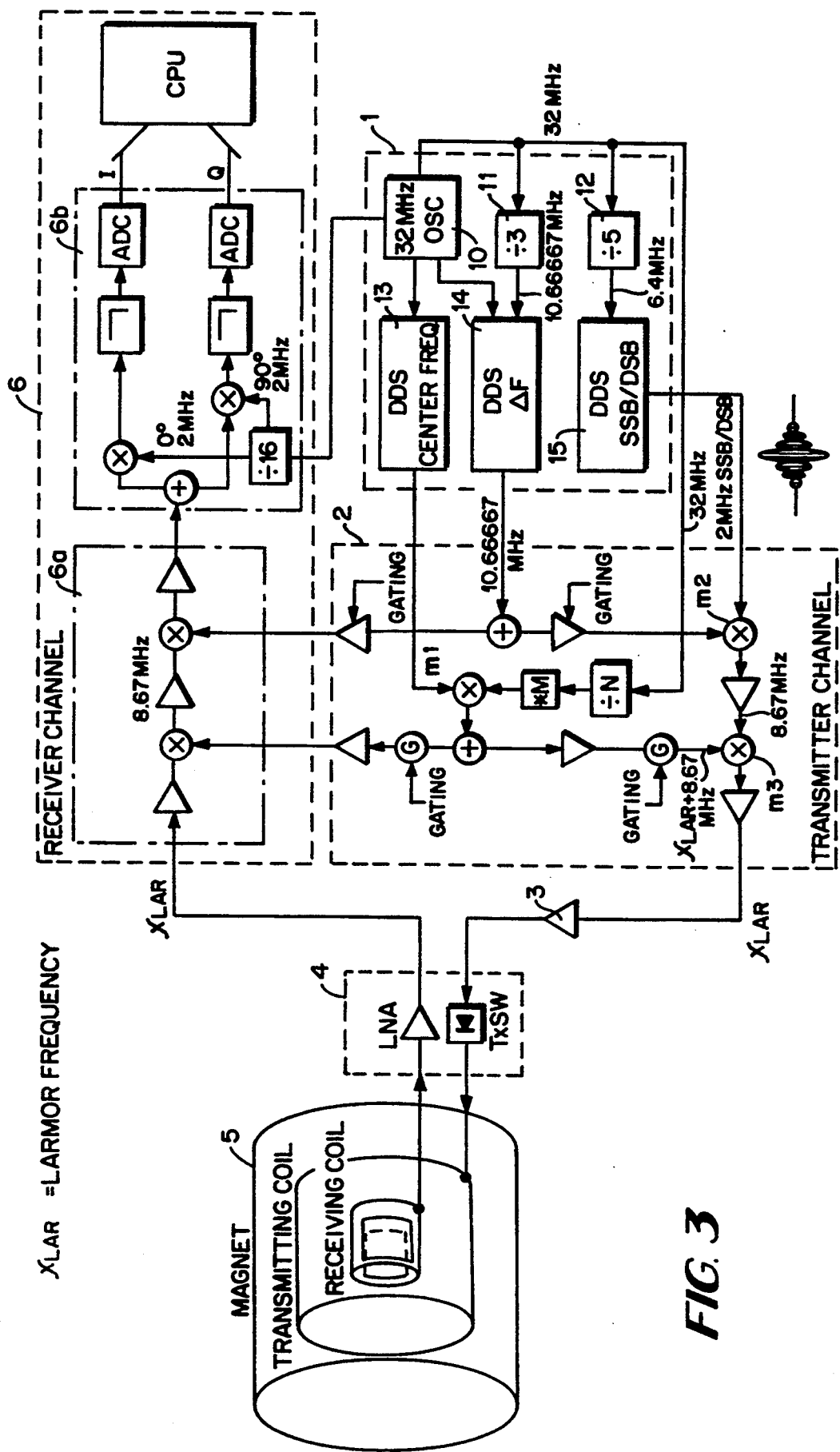
FIG. 3 is a block diagram of a digital MRI transmitter/receiver.

FIG. 3 shows an MRI transmitter/receiver using the local frequency generator circuit described above. The local frequency generator circuit 1 contains the 32 MHz crystal oscillator 10, dividers 11 and 12, DDS center frequency generating section 13, DDS ΔF generating section 14 and the 2 MHz SSB/DSB generating section 15. The local frequencies generated in circuit 1 are provided to the transmitter channel 2 where they are gated and mixed to provide a $f_{LAR}$ signal to the RF power amplifier 3. Via the front end section 4, the RF transmitter signal is applied to the transmitting coil in transmitter 5. The 32 MHz frequency, the DDS ΔF frequency and a $f_{LAR}+8.67$ frequency are supplied to the receiver channel 6.

In the transmitter channel 2, the 32 MHz clock is divided and multiplied to produce a signal corresponding to the selected field strength, as shown in the frequency chart of TABLE I, and mixed at mixer m1 with the DDS center frequency for the selected field strength to produce a signal $f_{LAR}+8.67$ MHZ. The DDS $\Delta F$ signal of 10.66667 MHz$\pm\Delta F$ is gated into a mixer m2 where it is mixed with the 2 MHz SSB/DSB signal to produce a signal of 8.67 MHz$\pm\Delta F$. The $f_{LAR}+8.67$ MHZ is gated into a mixer m3 and mixed with the 8.67 MHz$\pm\Delta F$ signal to produce a $f_{LAR}\pm\Delta F$ signal for power amplification. The output of each mixer (m1, m2 and m3) is band pass filtered to keep only the desired mixer output frequency. Filtering also reduces some noise associated with the mixing process.

As can be seen in FIG. 3, the local frequency generator provides a 32 MHz clock to the quadrature detection circuit 6b in receiver channel 6. The transmitter channel 2 provides gated $f_{LAR}+8.67$ MHZ and DDS $\Delta F$ frequencies to the RF processing circuit 6a in the receiver channel. As will be appreciated by those skilled in the art, received image signals are RF, IF and quadrature detected to provide audio signals to the CPU for processing.

The digital system described derives all frequencies from the 32 MHz crystal oscillator and is operable in a single side band mode or double side band mode. Since no phase locked loop is employed the system is capable of very fast frequency and phase shifting and has low phase noise. Moreover, the digital system allows for easy design and construction of a digital receiver. Due to the digital technology, stable quadrature modulation and elimination of RF carrier leakage, the system promotes accurate slice selectivity and advanced sequence procedures e.g., a sequence that selects multiple slices with different phases excited by one SEP. An example is using a pair of data sets where one is from an object with single side band excitation using a sinc to cover $-W$ to $W$. The second data set uses double side band excitation with only the cosinc giving a signal mix with negative signal from $-W$ to $0$ and positive signal from $0$ to $+W$. Adding these data sets together gives an image of the slice for $0$ to $+W$. Subtracting the data sets gives an image of the slice from $-W$ to $0$. Since each image comes from the addition or subtraction of two data sets, they have a square root of 2 better S/N.

The digital circuitry eliminates expensive frequency synthesizers, analog amplitude modulation circuits, RF carrier leakage in the analog amplitude modulation circuit, the unwanted side band in the quadrature amplitude modulation, and adjustments to maintain the performance of the RF modulation circuits. It provides for very fine frequency control and phase control, allows for the overall RF component count to be reduced by incorporating digital techniques for the RF gating and buffering, and permits easy migration into the digital receiver circuit.

While the invention has been described in connection with what is presently considered to be the most practical and preferred embodiment, it is to be understood that the invention is not to be limited to the disclosed embodiment, but on the contrary, is intended to cover various modifications and equivalent arrangements included within the spirit and scope of the appended claims.

What is claimed is:

1. A frequency generator comprising
   a direct digital synthesizer circuit,
   a clock circuit providing an input to said direct digital synthesizer circuit,
   said direct digital synthesizer circuit having an input unit for receiving frequency control settings, and
   a latch for receiving a clock signal and a frequency changing signal for resetting the frequency output from said direct digital synthesizer circuit, said latch synchronizing said frequency changing signal with said clock signal and providing a synchronized reset signal to said direct digital synthesizer circuit.

2. A frequency generator as in claim 1 wherein said direct digital synthesizer circuit input unit comprises a double buffer holding two phase increment values, active and inactive, and said synchronized reset signal clocks said inactive phase increment value into an active phase increment position.

3. A frequency generator as in claim 2 wherein said direct digital synthesizer circuit provides a digitized sine wave output, and said generator further comprises a digital to analog converter for converting said digitized sine wave output to a periodic analog waveform.

4. A frequency generator as in claim 3 and further comprising a fifth order narrow bandwidth bandpass filter for receiving and filtering said periodic analog waveform.

5. A frequency generator as in claim 2 and further comprising a divider circuit wherein a clock output from said clock circuit is divided in said divider circuit for providing said clock signal.

6. A single side band generating circuit comprising
   a clock circuit providing an input clock signal,
   a first direct digital synthesizer circuit receiving said clock signal and input frequency control signals and outputting digitized sine data,
   a second direct digital synthesizer circuit receiving said clock signal and input frequency control signals and outputting digitized cosine data,
   first and second digital multipliers receiving said clock signal, and said sine wave data and said cosine wave data, respectively,
   said first and second digital multipliers receiving modulation data,
   a latch circuit receiving said clock signal and a strobe input signal and providing first and second strobe signals to said first and second digital multipliers, and
   a digital adder receiving the outputs from said first and second digital multipliers and outputting modulated digitized single side band data.

7. A circuit as in claim 6 further comprising a digital to analog converter connected to receive said modulated digitized single side band data for converting said data to an analog periodic waveform.

8. A circuit as in claim 6 wherein said first and said second direct digital synthesizer circuits are first and second frequency sections of a single component.

9. A circuit as in claim 6 wherein said modulated digitized single side band data contains in-phase and quadrature modulation data, said circuit further comprises a digital to analog converter for converting said modulated single side band data to a modulated analog signal, and a band pass filter for filtering said modulated analog signal.

10. A double side band/single side band circuit comprising
    an oscillator circuit providing a clock signal,
    first and second direct digital synthesizer circuits receiving said clock signal and input frequency control signals and outputting digitized sine wave data and cosine wave data, a first digital multiplier receiving said clock signal, said digitized sine wave data, even function modulation data and a strobe, a second digital multiplier receiving said clock signal, said digitized cosine wave data, a strobe, and odd function modulation data for single side band operation, said odd function modulation data being set to zero for double side band operation, a latch circuit receiving said clock signal and an input strobe signal and outputting said strobe, and a digital adder receiving the output of said first digital multiplier and said second digital multiplier and providing modulated digitized output data.

11. A circuit as in claim 10 further comprising a digital to analog converter connected to receive said modulated digitized output data for converting said data to an analog periodic waveform.

12. A circuit as in claim 11 further comprising a narrow band pass filter for receiving and filtering said analog periodic waveform and reducing sidebands generated by the updating of the modulation data.

13. A circuit as in claim 10 wherein said oscillator circuit comprises a crystal oscillator and a frequency divider.

14. A circuit as in claim 10 wherein the polarity of the odd function modulation data in the single side band mode is set to select the upper side band or the lower side band.

15. A frequency generating circuit comprising a single crystal oscillator providing a clock, first and second direct digital synthesizer circuits, each having an input for receiving the output of said oscillator and an input for receiving a frequency control input, a latch associated with said second direct digital synthesizer circuit for synchronizing with said oscillator an input frequency change signal and providing a synchronized clock signal to said direct digital synthesizer, a first circuit connected to the outputs of said first direct digital synthesizer circuit for providing a first center frequency signal and a second output circuit connected to said second direct digital synthesizer circuit for providing a ΔF frequency signal, third and fourth direct digital synthesizer circuits having inputs for receiving a frequency control input and clock signals and providing digitized sine and cosine wave data outputs, a first multiplier for receiving said clock signal, said digitized sine wave data, modulation data and a first strobe, a second multiplier for receiving said clock, said digitized cosine wave data, second modulation data and a second strobe, a second latch for synchronizing a strobe signal input to said clock signal to provide said first and second strobe, an adder for adding the outputs of said first and said second multipliers, and an output circuit for providing modulated output data.

16. A circuit as in claim 15 wherein said modulated output data contains amplitude, quadrature modulated output data.

17. A circuit as in claim 15 wherein said modulated output data contain single side band modulated data.

18. A circuit as in claim 15 wherein a line carrying said second modulation data is set to zero and said modulated output is modulated double side band data.

19. A method of generating MRI transmitter local frequencies comprising, generating a clock signal, producing with said clock signal and a frequency setting input a digitized sine wave and converting said digitized sine wave to an analog waveform, producing with said clock signal, a frequency setting input and a strobe synchronized to said clock signal through a latch, a digitized variable sine wave and converting said digitized variable sine wave to a variable analog signal, and producing with said clock signal and a frequency setting input digitized modulated single side band data and converting said digitized modulated single side band data to a modulated single side band analog signal.

20. A multiple frequency generator comprising a single oscillator for producing a clock frequency, a first section comprising a direct digital synthesizer circuit connected to said oscillator for generating a first frequency, a second section comprising a direct digital synthesizer circuit connected to said oscillator, and in addition a frequency divider and a latch connected between said oscillator and said direct digital synthesizer circuit, for generating a second variable frequency, and a third section comprising direct digital synthesizer circuits connected via a divider to said oscillator for generating a single side band/double side band signal.

21. A MRI transmitter comprising a local frequency generator and a RF frequency generating channel, said frequency generator comprising a single crystal oscillator for producing a clock frequency, a center frequency section including a direct digital synthesizer circuit for producing a center frequency with said clock frequency, a variable ΔF frequency section including a direct digital synthesizer circuit for producing a variable ΔF frequency and a latch for synchronizing said variable ΔF frequency with said clock frequency, a single side band/double side band section including direct digital synthesizer circuits for producing a modulated side band signal from a sub multiple of said clock frequency, said RF frequency generating channel comprising, a first mixer for mixing said center frequency and a sub multiple of said clock frequency, a second mixer for mixing said ΔF frequency and said modulated side band signal, and a third mixer for mixing the outputs of said first and second mixers.

* * * * *